United States Patent [19]

Delage et al.

[11] Patent Number: 5,668,388

[45] Date of Patent: Sep. 16, 1997

[54] BIPOLAR TRANSISTOR WITH OPTIMIZED STRUCTURE

[75] Inventors: Sylvain Delage, Bures Sur Yvette; Marie-Antoinette Poisson, Paris; Christian Brylinski, Neuilly Sur Seine; Hervé Blanck, Arcueil, all of France

[73] Assignee: Thomson-CSF, Paris, France

[21] Appl. No.: 674,564

[22] Filed: Jul. 5, 1996

[30] Foreign Application Priority Data

Jul. 7, 1995 [FR] France ................... 95 08238

[51] Int. Cl.$^6$ ............ H01L 31/0328; H01L 31/0336; H01L 31/072; H01L 31/109
[52] U.S. Cl. ........................ 257/197; 257/198; 257/200; 257/201; 257/586
[58] Field of Search ................. 257/197, 198, 257/200, 201, 586

[56] References Cited

U.S. PATENT DOCUMENTS

| 5,041,882 | 8/1991 | Katoh ......................... 357/16 |
| 5,194,403 | 3/1993 | Delage et al. . |
| 5,298,439 | 3/1994 | Liu et al. . |
| 5,411,632 | 5/1995 | Delage et al. ........... 156/652.1 |

FOREIGN PATENT DOCUMENTS

| 86400418.9 | 2/1986 | European Pat. Off. ....... H01L 29/72 |
| 0 194 197 | 9/1986 | European Pat. Off. . |
| 94304131.9 | 8/1993 | European Pat. Off. ....... H01L 29/73 |
| 0 630 053 A3 | 12/1994 | European Pat. Off. . |
| 6-236892 | 8/1994 | Japan . |

OTHER PUBLICATIONS

H. Ito, et al. "Compositionally Graded Emitter InGa(As)P/GaAs Heterojunction Bipolar Transistors", Electronics Letters, vol. 30, No. 25, (pp. 2174–2175), Dec. 8, 1994.

G.B. GAO, et al. "$Al_xGa_{1-x}As/Al_yGa_{1-y}As$ and GaAs Pseudo-Heterojunction Bipolar transistors with Lateral Emitter Resistor", Applied Physics Letters, vol. 62, No. 9, (pp. 994–996), Mar. 1, 1993.

Primary Examiner—Sara W. Crane
Assistant Examiner—Douglas Wille
Attorney, Agent, or Firm—Oblon, Spivak, McClelland, Maier & Neustadt, P.C.

[57] ABSTRACT

A bipolar transistor in which the emitter possesses a double "mesa" structure so as to achieve the maximum avoidance of the phenomena of electron/hole recombinations that have a deleterious effect on the current gain. The double mesa emitter can be made out of an alternation of materials $M_I/M_{II}$ having different types of behavior with respect to a pair of etching methods. These materials may be GaInP and GaAs.

5 Claims, 5 Drawing Sheets

BIPOLAR TRANSISTOR WITH OPTIMIZED STRUCTURE

BACKGROUND OF THE INVENTION

1. Field of the Invention

The field of the invention is that of bipolar transistors and especially vertical structure heterojunction bipolar transistors in which the current is conveyed perpendicularly to the surface of the substrate, these transistors being used for microwave applications.

They are formed by a stack of layers of semiconductor materials, at least one surface layer of which is etched in "mesa" form, namely in a raised or embossed pattern. FIG. 1 describes the conventional structure of a heterojunction bipolar transistor or HBT whose emitter, base and collector are at three different levels. Conventionally, a contact $C_E$ is made on the surface of the emitter by the superimposing of matched layers. Laterally, two contacts $C_{B1}$ and $C_{B2}$ are made in the base on either side of the emitter and two contacts $C_{C1}$ and $C_{C2}$ are also made in the collector on either side of the base.

This type of vertical structure raises a problem of electron/hole recombinations at the free surfaces $s_1$ and $s_2$ shown in FIG. 1. These recombinations play a major role in the deterioration of gain in current.

The smaller the transistors, the greater is this phenomenon (through leakage of electrons at the edges). The microwave applications of vertical structures of this kind are therefore highly penalized by this problem. Indeed, for operation in microwave applications, a bipolar transistor consists of several parallel-connected elementary transistors (also called fingers) and in order to limit the base resistance of an elementary transistor, it is necessary to limit the width of the emitter. Typically, the width of a finger must be in the range of 2 μm for applications at frequencies below 100 GHz while the length of the emitter finger may be about 30 microns.

2. Description of the Prior Art

There have already been certain solutions brought to bear on this problem, especially for HBT transistors made with GaAlAs/GaAs materials. In particular, one approach envisaged has been that of introducing a passivation layer between the emitter and the base creating an intermediate depopulated zone in which the electron/hole recombinations are made practically impossible because of the disappearance of the free carriers in this zone. More specifically, FIG. 2 shows a structure in which the emitter has a particular architecture obtained by partial etching of a GaAlAs layer deposited on a p doped GaAs layer constituting the base. Two contacts $C_{B1}$ and $C_{B2}$ are made at the emitter level on the surfaces $s'_1$ and $s'_2$. Then, by an appropriate processing operation, these contacts may be diffused over the thickness $e_o$. In this configuration, the electron/hole recombinations in the base, which were earlier fostered on the free surface of the base, are limited because of the emitter thickness $e_o$ kept above the base. The problem with this type of structure however lies in its poor stability inasmuch as the diffusion made for the contacts cannot be entirely controlled and may therefore continue to develop with time and temperature.

This is why the invention proposes an optimized heterojunction bipolar transistor structure in which the surface recombinations are minimized through a particular emitter architecture.

SUMMARY OF THE INVENTION

More specifically, an object of the invention is a heterojunction bipolar transistor based on group III–V semiconductor materials comprising a substrate on which there are respectively superimposed a collector, a base and an emitter, wherein the emitter has a so-called "double mesa" structure comprising at least three layers (1), (2) and (3) of semiconductor materials $M_I$, $M_{II}$, $M_{III}$, that are superimposed starting from the base, the layers (1) and (2) having a greater section than the section of the layer (3), the sections of the layers being defined in parallel to the substrate, the layer (1) being weakly doped to provide for the passivation function.

Preferably, the layers (1) and (3) are formed out of the same semiconductor material $M_I$, the materials $M_I$ and $M_{II}$ having different types of behavior with respect to a pair of etching methods.

In the bipolar transistor according to the invention, the material $M_I$ is preferably GaInP, the material $M_{II}$ being preferably GaAs.

The heterojunction bipolar transistor may furthermore advantageously include a layer (4) integrated between the emitter itself and layers providing access to the contact $C_E$. This layer may typically be prepared out of the material (III) more weakly doped than in the layer (3) to form a ballast resistor integrated into the emitter.

The presence of this layer (4) may prove to be particularly valuable in power applications that particularly use parallel-mounted heterojunction bipolar transistors, these being applications for which the phenomenon of thermal racing is crucial.

Indeed, the fundamental mechanism of thermal racing arises out of the difference of about −1.5 mV/K in the characteristic $I_E$ ($V_{BE}$) (emitter current as a function of the voltage applied between the emitter and the base). This means that a fraction of the elementary component drains most of the emitter current. If for example the base current is fixed, the greater the heat of the component the more the current gets concentrated in the hottest zones which are increasingly localized. This mechanism finally induces the formation of a hot point which leads to the destruction of the device.

The use of an integrated resistor as compared with the conventional approach in which an external resistor is added to the emitter makes it possible to reduce the value of the resistance needed to overcome thermal racing by about 30% (assessed experimentally), which consequently leads to a substantially higher level of performance.

BRIEF DESCRIPTION OF THE DRAWINGS

The invention will be understood more clearly and other advantages will appear from the following description, given by way of a non-restrictive example and from the appended figures, of which.

MORE DETAILED DESCRIPTION

Figure 1:
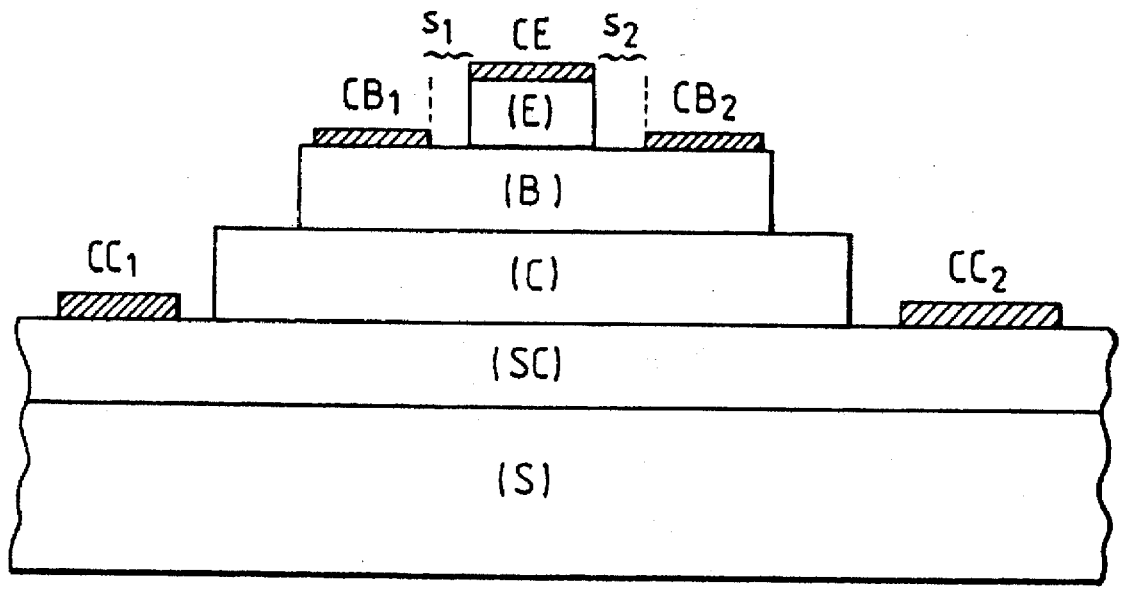
FIG. 1 illustrates a standard bipolar transistor structure.
Figure 2:
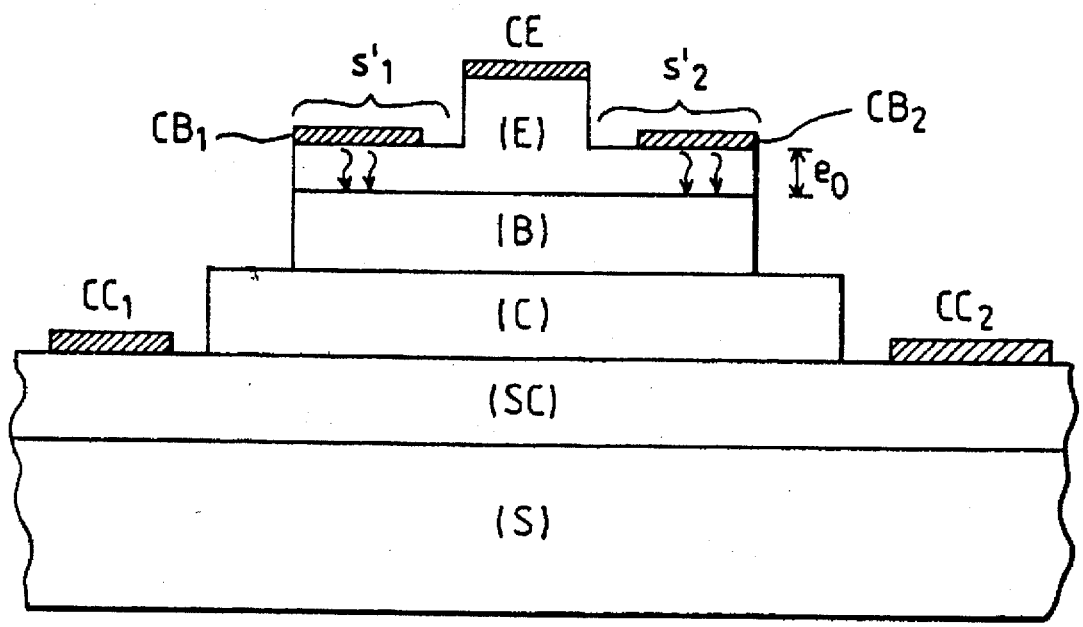
FIG. 2 illustrates an architecture of a bipolar transistor according to the prior art.
Figure 3:
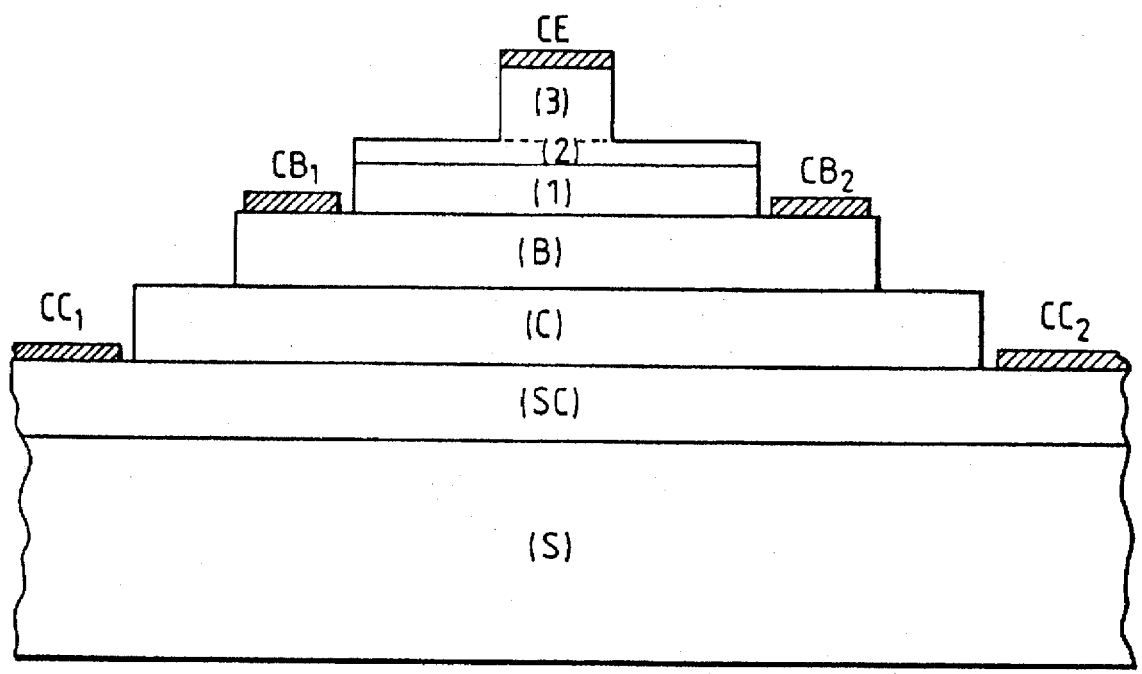
FIG. 3 illustrates the bipolar transistor structure according to the invention.

The invention proposes a novel bipolar transistor architecture, and especially a heterojunction bipolar transistor architecture in which the emitter has an original structure. FIG. 3 illustrates this structure consisting of at least three layers (1), (2) and (3) superimposed on the base B which is itself superimposed on the collector C. By using materials $M_I$ and $M_{III}$ such that their etching is very well controlled on the base B and the layer (2) respectively, it is possible to achieve the "double mesa" architecture of the emitter on the base. This makes it possible therefore to prepare the base contacts $C_{B1}$ and $C_{B2}$ without resorting to processes of diffusion in the emitter medium as proposed in the prior art.

The invention shall be described in the precise case of a heterojunction bipolar transistor made with GaInP and GaAs semiconductor materials. Indeed, this pair of materials is particularly valuable as compared with the more conventional GaAl/As/GaAs system for several reasons.

There are several etching methods, either by aqueous chemical means or by dry etching, that can be used to selectively etch the pair GaInP/GaAs. Thus, it is possible to entirely etch a layer made of GaInP and stop at a layer of GaAs with an infinite degree of selectivity.

More specifically, using an epitaxially grown transistor structure having all the functional layers of semiconductor materials, it is possible to obtain the geometry illustrated in FIG. 3.

Figure 4:
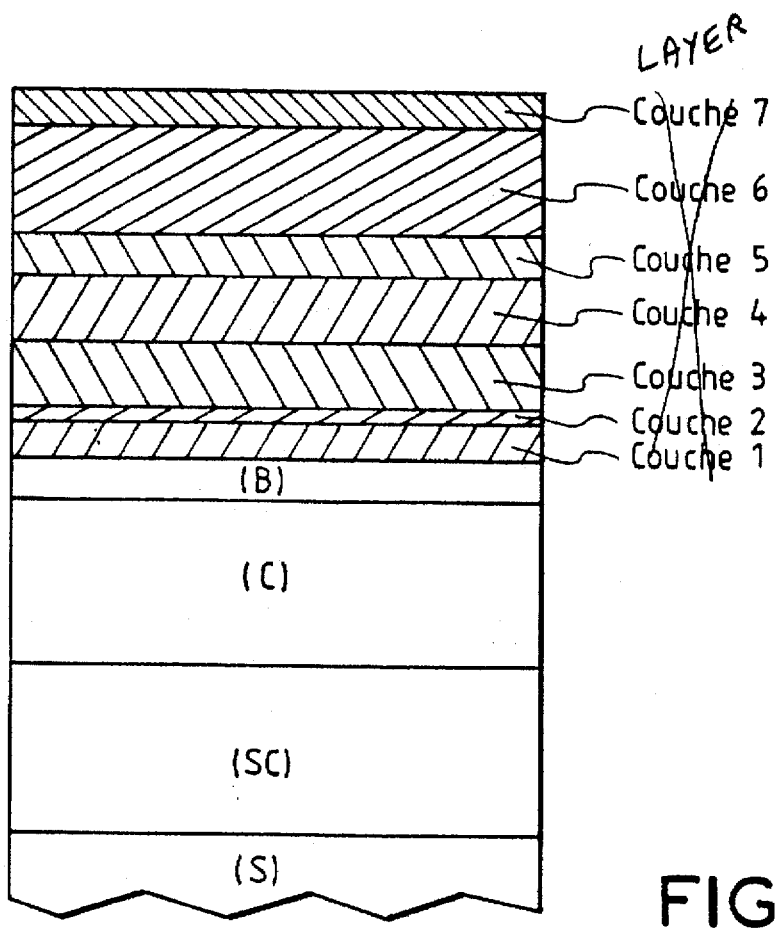
FIG. 4 illustrates an exemplary epitaxial structure, used in a heterojunction bipolar transistor according to the invention.

The heterojunction bipolar transistor can thus be made out of a succession of the following layers illustrated in FIG. 4.

On a semi-insulator GaAs substrate S, the following are made in a standard way:

- a sub-collector layer (SC) which is typically made of GaAs (Si) with n doping in a concentration of $4.10^{18}$ cm$^{-3}$ and a thickness of the order of 800 nm;
- a collector layer (C) made of GaAs (Si) with n doping in a concentration of $2.10^{16}$ cm$^{-3}$ and a thickness of the order of 1,000 nm;
- a base layer (B) made of GaAs (carbon) with p doping in a concentration of the order of $7.10^{19}$ cm$^{-3}$ and a thickness of the order of 120 nm.

Then, the following layers of the emitter structure to which the invention pertains are made:

- a layer (1) made of GaInP (Si) with n doping in a concentration of $3.10^{17}$ cm$^{-3}$ and a small thickness of about 30 nm;
- a layer (2) made of GaAs (Si) with n doping in a concentration of $3.10^{18}$ cm$^{-3}$ and a very small thickness of about 5 nm;
- a layer (3) made of GaInP (Si) with n doping in a concentration of $3.10^{17}$ cm$^{-3}$ and a thickness of about 120 nm.

Preferably, a ballast resistor layer is integrated into the emitter structure. This is a layer (4) with a doping concentration lower than the doping of the layers (1) to (3), namely:

- a layer (4) made of GaInP (Si) with n doping in a concentration of $7.10^{16}$ cm$^{-3}$ and a thickness of 250 nm.

The following are also integrated in a conventional way:

- a layer (5) of GaInP (Si) with high n doping in a concentration of $3.10^{18}$ cm$^{-3}$ and a thickness of about 100 nm. This layer is used as a transition layer between the emitter which is formed mainly by GaInP and an upper layer made of GaAs, making it easier to set up the ohmic contact of the emitter;
- a layer (6) of GaAs (Si) with high doping in a concentration of $3.10^{18}$ cm$^{-3}$ and a thickness in the region of 200 nm;
- an optional layer (7) made of $Ga_{1-x}In_xAs$ (Si) with doping in a concentration of $3.10^{18}$ cm$^{-3}$ and a thickness of 20 nm on which the emitter contact CE is made.

Using the stack of all these layers, the desired architecture is made by the selective etching of the pair GaInP/GaAs. The lateral dimension of the "mesa" comprising the layer (3) is fixed by a dry etching method such as reactive ion etching (RIE) which uses the emitter ohmic contact as an etching mask; the emitter contacts CE are made beforehand on the upper layer (7). The metallizations used to make the metal contacts may be an alloy of AuGe/Ni/Au.

In a second stage, the entire unit may be covered with a positive resin, subsequently etched at the position where it is desired to demarcate the lower "mesa" corresponding to the layers (1) and (2). In the zones not covered with resin, the layers (1) and (2) are etched up to the surface of the base.

Figure 5:
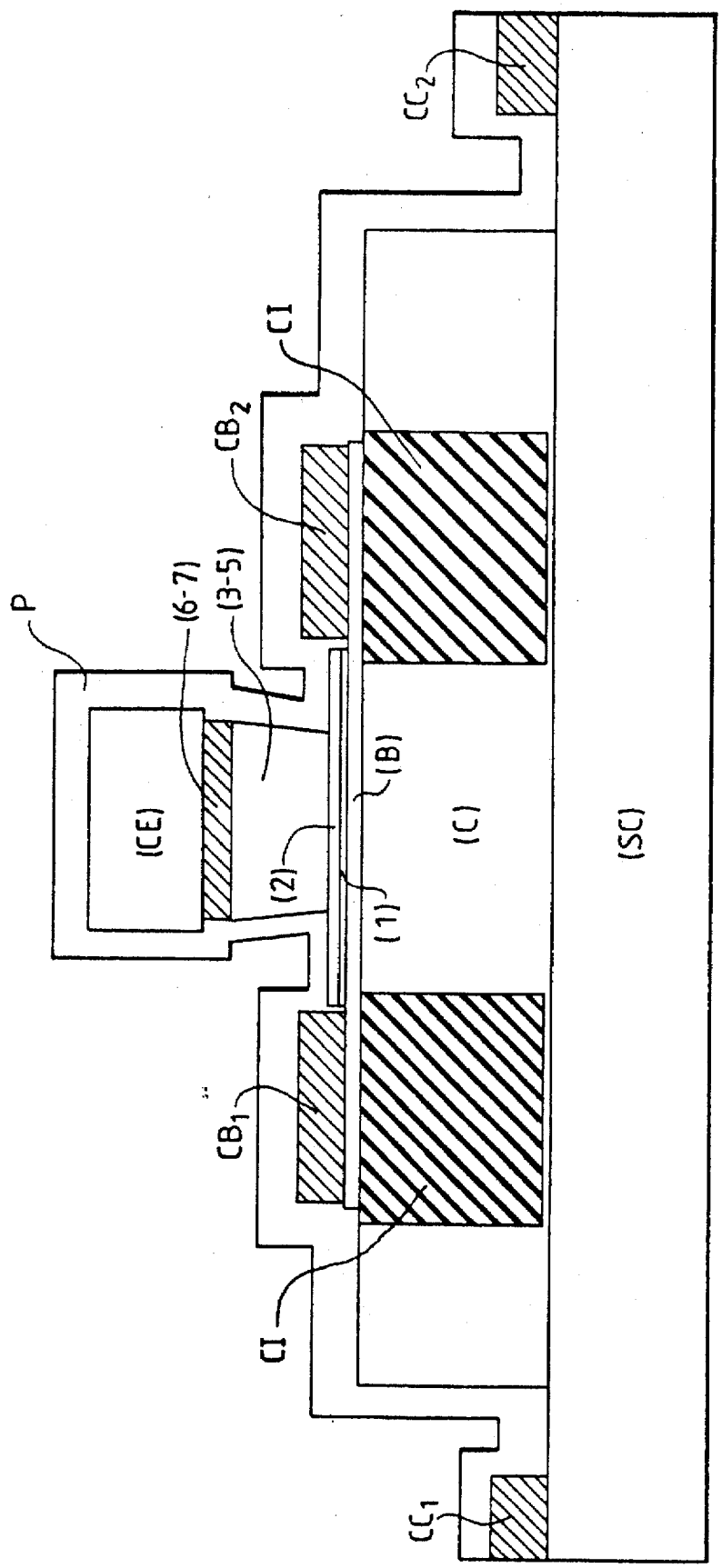
FIG. 5 shows a general sectional view of an exemplary bipolar transistor according to the invention.
Figure 6A:
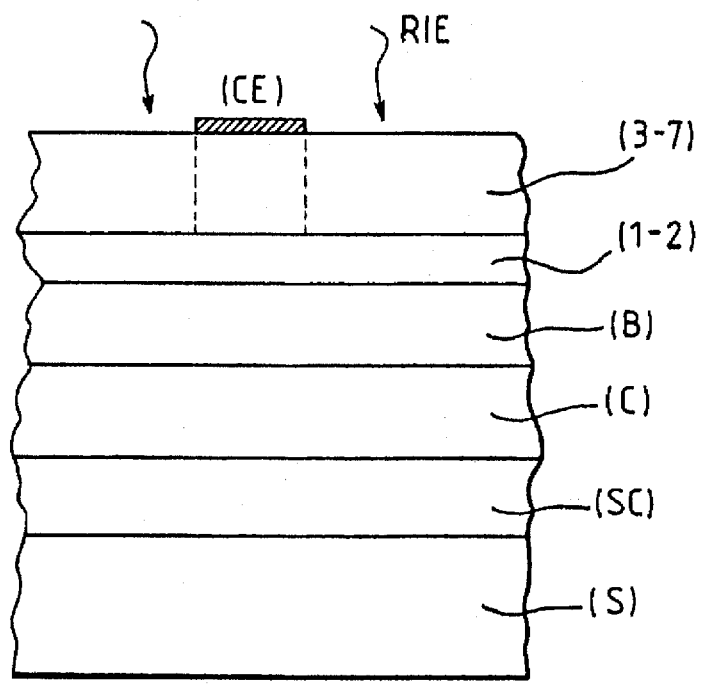
FIGS. 6(a)–6(c) detail steps in making the device of FIG. 1.
Figure 6B:
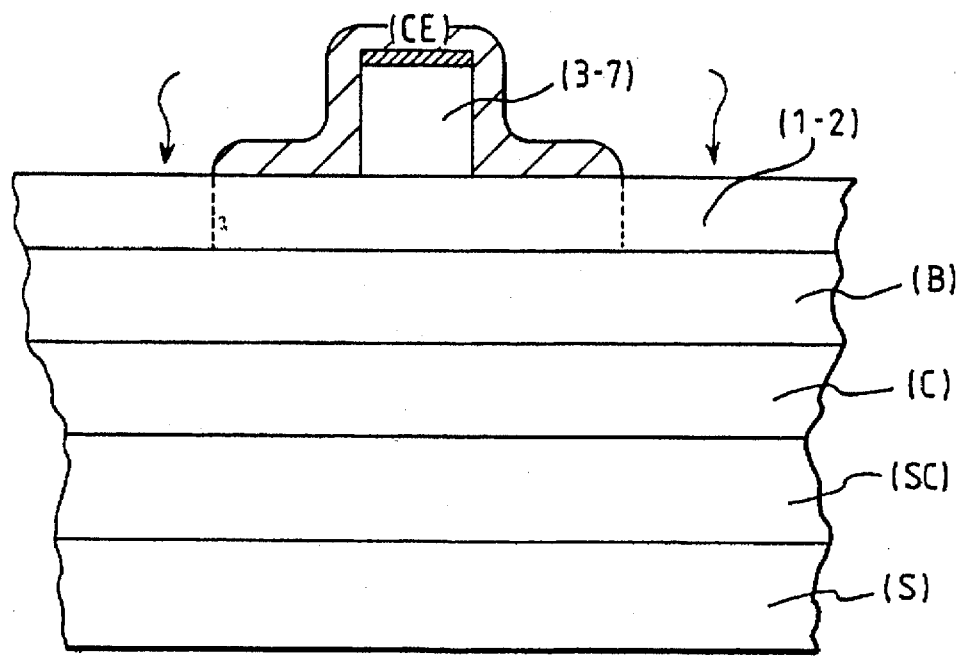
Figure 6C:
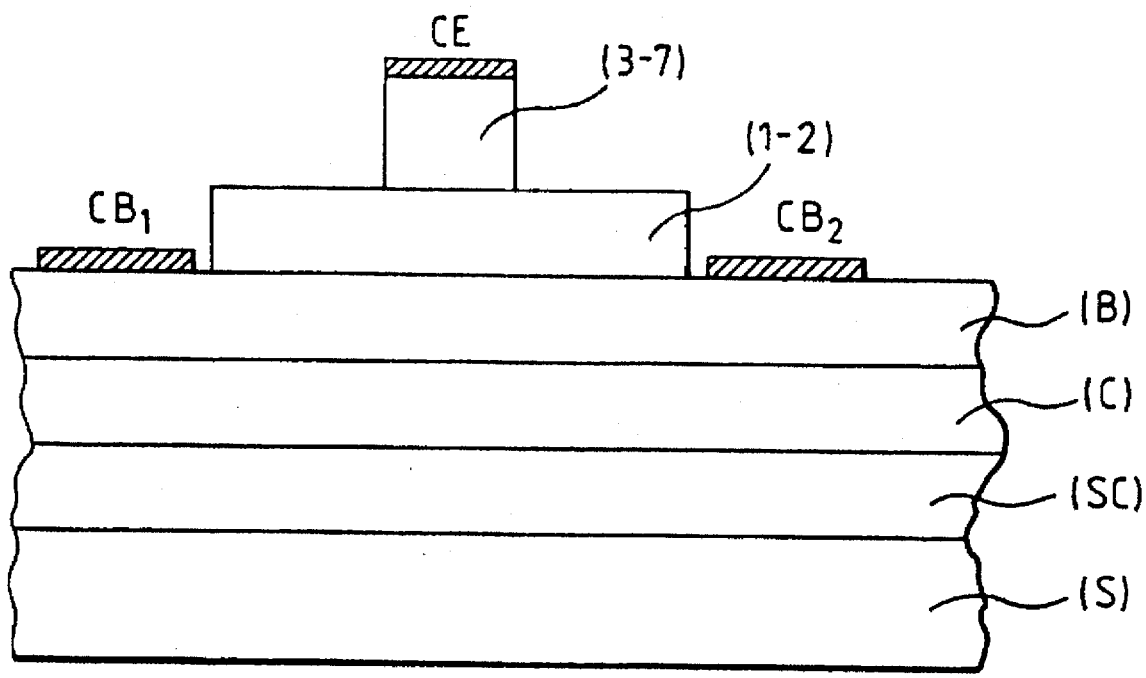

By ion implantation of boron, it is possible to prepare electrical insulation trenches (CI) so as to limit the base-collector capacitance values. The boron gets diffused in depth beneath the base layer, on which it is possible subsequently to define the base contacts $CB_1$ and $CB_2$ by metallization (illustrated in FIG. 5).

The removal of the resin on the protected zones leads to the obtaining of the desired structure.

The entire unit is covered with a protective passivation layer (P).

What is claimed is:

1. A heterojunction bipolar transistor including Group III-V semiconductor materials, said transistor comprising:

a substrate having a respectively superimposed collector, base and emitter, wherein the emitter has a double mesa structure comprising at least a first layer, a second layer and a third layer that are superimposed starting from the base, said first and said second layer having a greater section than a section of said third layer, the sections of the first, second and third layers being defined in parallel to the substrate, wherein said first layer and said third layer are made of a first semiconductor material and wherein said base and said second layer are made of a second semiconductor material with said first and second semiconductor materials exhibiting different behavior with different etching methods.

2. A heterojunction bipolar transistor according to claim 1, wherein the first material is GaInP and the second material is GaAs.

3. A heterojunction bipolar transistor according to claim 1, wherein the emitter also has a fourth layer superimposed on the third layer, said fourth layer being more weakly doped than said third layer so as to constitute a ballast resistor integrated with the transistor.

4. A heterojunction bipolar transistor according to claim 1, further comprising at least one layer facilitating the setting up of an ohmic contact with higher doping than the layers constituting the emitter.

5. A heterojunction bipolar transistor according to claim 1, further comprising electrical insulation trenches formed by ion implantation at the collector, on either side of the superimposition of the collector, base and emitter.

* * * * *